United States Patent [19]

Rhodes et al.

[11] Patent Number: 4,536,951
[45] Date of Patent: Aug. 27, 1985

[54] METHOD OF PRODUCING A LAYERED STRUCTURE

[75] Inventors: Stephen J. Rhodes; Raymond E. Oakley, both of Northampton, England

[73] Assignee: Plessey Overseas Limited, Ilford, England

[21] Appl. No.: 621,187

[22] Filed: Jun. 15, 1984

[30] Foreign Application Priority Data

Jun. 16, 1983 [GB] United Kingdom ................ 8316476

[51] Int. Cl.³ ...................... H01L 21/28; H01L 21/88
[52] U.S. Cl. ................................. 29/589; 29/577 C; 29/591; 357/71; 427/89
[58] Field of Search .................. 29/589, 590, 591, 571, 29/577 C; 357/65, 71; 427/88, 89, 90; 148/DIG. 20

[56] References Cited

U.S. PATENT DOCUMENTS 4,321,284 3/1982 Yakushiji ........................ 29/591 X
4,392,298 7/1983 Barker et al. ........................ 427/89

Primary Examiner—Brian E. Hearn
Assistant Examiner—David A. Hey
Attorney, Agent, or Firm—Fleit, Jacobson, Cohn & Price

[57] ABSTRACT

A method of forming a layered structure, which method comprises depositing a first metal layer on a substrate, depositing a barrier layer on the first metal layer, depositing a second metal layer on the barrier layer, forming a first masking pattern on the second metal layer, etching the first and second metal layers and the barrier layer in accordance with the first masking pattern, removing the first masking pattern, forming a second masking pattern on the second metal layer, etching the second metal layer in accordance with the second masking pattern, removing the second masking pattern, depositing a dielectric layer having a thickness sufficient to cover the second metal layer, etching the dielectric layer to expose the second metal layer, and depositing on the etched dielectric layer and exposed second metal layer a further metal layer to contact the exposed second metal layer.

10 Claims, 5 Drawing Figures

METHOD OF PRODUCING A LAYERED STRUCTURE

This invention relates to a method of producing a layered structure, which layered structure may be used for forming electrical interconnections in an integrated circuit.

Integrated circuits and especially one micron feature size integrated cicuits require the formation of layered structures comprising various levels of metal defining between them vias, that is, metal to metal connections.

A current method of forming vias in a two level metal scheme is to form a first metal layer, consisting of metal tracks in a dielectric material, and then to deposit a layer of dielectric over the first metal layer. Via holes are then formed in the dielectric layer where it is required to form interconnections between the metal layers. The second metal layer, also consisting of metal tracks in a dielectric material is then formed and the interconnections with the first metal layer are made through the via holes. The via holes are delineated in the dielectric layer so that, in the resulting layered structure, each via is provided with a metal surround in both metal layers. The width of the metal surround must be sufficient to ensure that, allowing for extremes of alignment tolerances and metal track dimensions, the via always lies within the metal tracks in both metal layers. This type of via is known as a nested via and it is evident that the need to provide the via surround greatly increases via pitch and hence reduces packing density in the resultant structure.

It is possible to reduce via pitch by forming non-nested vias, that is vias which are not provided with a metal surround. However, non-nested vias can give rise to defects in the resulting layered structure. As there is no metal surround the dielectric in which the metal tracks in the first metal layer are formed may be etched during the etching process used to form the via holes in the overlying dielectric layer. This produces very deep via holes in which it is difficult to deposit the second metal layer with constant thickness. Often, the second metal layer contains portions of very shallow thickness and micro-cracks, giving rise to circuit defects, can frequently occur. Furthermore, the first metal layer may become exposed during the etch process to form the metal tracks in the second metal layer. Hence, the first metal layer will also be etched, forming portions of reduced thickness in the metal tracks of the first metal layer. These portions of reduced thickness can lead to premature failure of the layered structure in use.

It is an aim of the present invention to provide a method of producing a layered structure having metal track widths and metal to metal gaps of one micron or less on both first and second metal layers, and also to provide a via within the same metal pitch.

A feature of the present invention is the method by which the interconnections between the layers of metal are formed, which method obviates the need for via holes with subsequent metal filling. In the present method a pillar of metal is formed where a via is required and an insulating layer of dielectric material is deposited around the pillars. In this way a subsequent metal layer will only connect with the pillars of metal, the subsequent metal layer being isolated from an underlying metal layer by the insulating layer of dielectric material.

According to the present invention there is provided a method of forming a layered structure, which method comprises depositing a first metal layer on a substrate, depositing a barrier layer on the first metal layer, depositing a second metal layer on the barrier layer, forming a first masking pattern on the second metal layer, etching the first and second metal layers and the barrier layer in accordance with the first masking pattern, removing the first masking pattern, forming a second masking pattern on the second metal layer, etching the second metal layer in accordance with the second masking pattern, removing the second masking pattern, depositing a dielectric layer having a thickness sufficient to cover the second metal layer, etching the dielectric layer to expose the second metal layer, and depositing on the etched dielectric layer and exposed second metal layer a further metal layer to contact the exposed second metal layer.

Layered structure having several layers of metallisation may be fabricated by repeating the above method until the further metal layer is the final metal layer in the required layered structure.

Preferably, etching of the various layers is achieved by anisotropic plasma etching. The anisotropic plasma etching used to etch the metal layers and the dielectric layers may comprise carbon tetrachloride plasma eteching.

An embodiment of the present invention will now be described, by way of example, with reference to the accompanying drawings in which.

Figure 1:
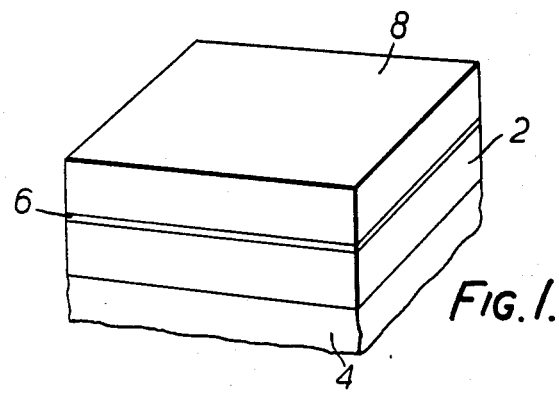
FIG. 1 illustrates a structure having first and second layers of metal sandwiching a barrier layer of etch barrier material.

Referring to the drawings, a first metal layer 2 is deposited on a substrate 4, such as a silicon substrate. A barrier layer 6 of etch barrier material, such as chromium, is then deposited on the first metal layer 2. A second metal layer 8 is then deposited on the barrier layer 6 to give the structure shown in FIG. 1. The metal layers 2 and 8 are, preferably, 1 micron layers of aluminium. The aluminium may be pure aluminium or aluminium doped with silicon and/or copper.

Figure 2:
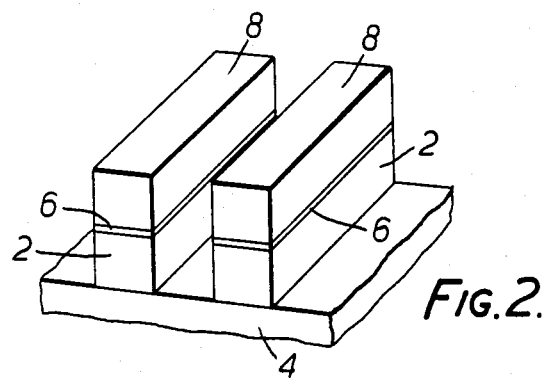
FIG. 2 illustrates the structure of FIG. 1 after etching in accordance with a first masking pattern.

A first masking pattern, not shown, is formed on the surface of the second metal layer 8. The first masking pattern delineates the interconnect pattern required in the first level metallisation in the resulting layered structure. The structure shown in FIG. 1 is then etched by anisotropic plasma etching to produce the structure shown in FIG. 2. It can be seen that the structure shown in FIG. 2 does not contain any undercuts.

The first and second metal layers 2 and 8 may be etched using carbon tetrachloride plasma etching. However, in order to etch the barrier layer 6, it is necessary to modify the plasma chemistry. This may be achieved by introducing oxygen into the plasma whilst the barrier layer 6 is etched. The plasma chemistry can then revert to carbon tetrachloride plasma to etch the underlying first metal layer 2.

A polyimide may now be spun onto the surface of the second metal layer 8 in order to achieve a planar surface. This stage of planarisation is not essential and may be omitted. The metal pillars 10, shown in FIG. 3, which form the vias in the final structure are now fabricated. This is achieved by depositing a second masking pattern on the structure shown in FIG. 2. The second masking pattern delineates the areas of the second metal layer 8 where the metal pillars 10 are required. The masking pattern, being any known photo-resist material has a rather poor image and will to some extent extend beyond the defined areas of the second metal layer 8 but will not extend between adjacent metal tracks defined in the second metal layer 8 after etching in accordance with the first masking pattern. This overlap in the masking pattern does not adversely affect the formation of the metal pillars 10 as each metal pillar 10 is defined in a portion of the second metal layer 8 which underlies the masking pattern.

Figure 3:
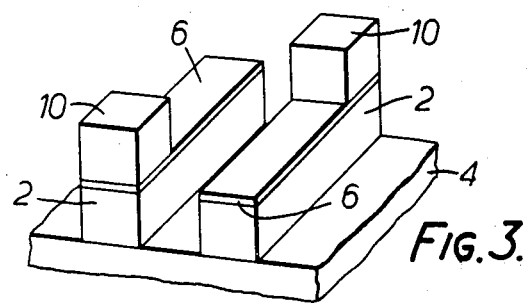
FIG. 3 illustrates the structure of FIG. 2 after the second metal layer has been etched in accordance with a second masking pattern.

The second metal layer 8 is plasma etched in accordance with the second masking pattern down to the barrier layer 6 to produce the structure shown in FIG. 3 with the metal pillars 10 extending from and accurately aligned to the metallisation pattern in the first metal layer 2. The metal pillars 10 are accurately aligned as they are partly formed during the etch used to form the metallisation pattern in the first metal layer 2.

In etching the second metal layer 8 in accordance with the second masking pattern, the effect of the barrier layer 6 is twofold. Firstly, the plasma used to etch the second metal layer 8 does not affect the barrier layer 6 and hence, the pillars 10, which form the vias in the resulting layered structure, are of controlled substantially uniform height. Secondly, the thickness of the first metal layer in the final structure can be accurately defined as the first metal layer 2 is not etched during the second etch of the second metal layer 8 because of the presence of the barrier layer 6.

A dielectric layer 12 is now deposited over the structure shown in FIG. 3 by, for example, successive spin coatings and cure operations. The dielectric layer is deposited to a thickness sufficient to encase the structure of FIG. 3 so that the pillars 10 are surrounded and covered by the material of the dielectric layer so as to provide a planar surface over the metal pillars 10. The dielectric layer 12 is, preferably, formed from a polyimide material such as that sold under the trade name PIQ by Hitachi.

The dielectric layer is then plasma etched to expose the top surfaces of the metal pillars 10. The dielectric layer 12 may be etched using carbon tetrachloride plasma and suitable means may be included in the plasma chamber to ensure that the etch process is terminated as soon as the surfaces of the metal pillars 10 are exposed. The resulting structure is shown in FIG. 4 and the exposed surfaces of the metal pillars 10 form the connections to the next metal layer.

Figure 4:
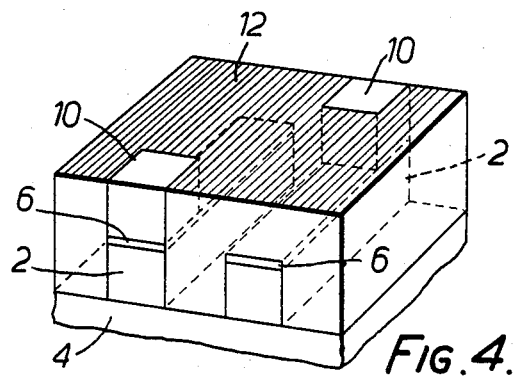
FIG. 4 illustrates the structure of FIG. 3 after a layer of dielectric has been deposited and etched to expose the surface of the second metal layer.
Figure 5:
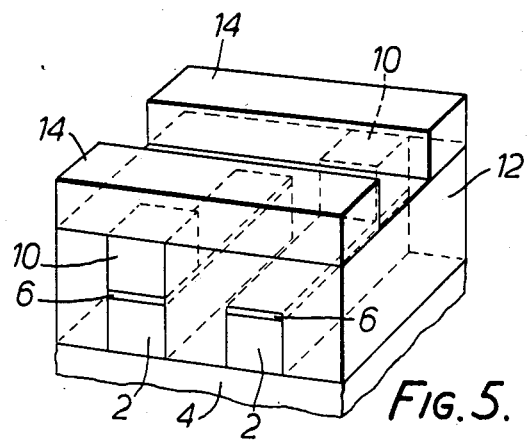
FIG. 5 illustrates a further metal layer, after etching, deposited on the structure shown in FIG. 4.

A further metal layer 14 is then deposited on the structure shown in FIG. 4. The metal layer 14 will contact the surfaces of the pillars 10 exposed in the dielectric layer 12. It will now be seen that the metal pillars 10, consisting of the remaining portions of the second metal layer 8, form the metal to metal connections between the first metal layer 2 and the metal layer 14, that is, the pillars 10 form the vias between the metal layers 2 and 14.

If only two level metallisation is required in the layered structure, the further metal layer 14 will be the final metal layer of the structure.

A final masking pattern may be formed on the metal layer 14 and the metal layer 14 may be etched in accordance with the final masking pattern to remove unwanted metal from the field regions in the second level metallisation.

If more than two level metallisation is required a barrier layer and a subsequent metal layer, similar to the barrier layer 6 and second metal layer 8, may be deposited on the further metal layer 14. The sequence of operations can then be repeated until the desired multi-level metallisation structure is formed, the final metal layer being etched to remove unwanted metal in the field regions as described above for the further metal layer 14 in connection with a two level metallisation structure.

As the method of the present invention provides vias, in the form of the metal pillars 10, which are aligned accurately to the metallisation in the first metal layer 2, maximum via size in the minimum space available is achieved.

It is to be appreciated that the embodiment of the present invention described above with reference to the accompanying drawings has been given by way of example only and that modifications can be effected. Thus, for example, materials other than aluminium may be used for the metal layers and one such material is tungsten. Similarly, although the etch barrier material has been described as chromium, other materials, such as titanium may be employed.

We claim:

1. A method of forming a layered structure, which method comprises depositing a first metal layer on a substrate, depositing a barrier layer on the first metal layer, depositing a second metal layer on the barrier layer, forming a first masking pattern on the second metal layer, etching the first and second metal layers and the barrier layer in accordance with the first masking pattern, removing the first masking pattern, forming a second masking pattern on the second metal layer, etching the second metal layer in accordance with the second masking pattern, removing the second masking pattern, depositing a dielectric layer having a thickness sufficient to cover the second metal layer, etching the dielectric layer to expose the second metal layer, and depositing on the etched dielectric layer and exposed second metal layer a further metal layer to contact the exposed second metal layer.

2. A method according to claim 1 wherein the method is selectively repeated until the further metal layer comprises the final metal layer of the layered structure.

3. A method according to claim 1 wherein the further metal layer comprises the final metal layer of the layered structure.

4. A method according to claim 2 wherein a final masking pattern is formed on the final metal layer and the final metal layer is etched in accordance with the final masking pattern to remove unwanted metal therefrom.

5. A method according to claim 4 wherein the layers are etched by anisotropic plasma etching.

6. A method according to claim 5 wherein the metal layers are etched by carbon tetrachloride plasma etching.

7. A method according to claim 5 wherein the barrier layer is etched by carbon tetrachloride and oxygen plasma etching.

8. A method according to claim 4 wherein the metal layers comprise aluminium.

9. A method according to claim 4 wherein the dielectric comprises polyimide.

10. A method according to claim 4 wherein the barrier layer comprises chromium.

* * * * *